United States Patent
Dang et al.

(10) Patent No.: US 10,852,800 B1
(45) Date of Patent: Dec. 1, 2020

(54) MULTI-MODAL POWER CONTROL

(71) Applicant: Cadence Design Systems, Inc., San Jose, CA (US)

(72) Inventors: Duc Dang, San Jose, CA (US); Ty Doan, San Jose, CA (US); Pinchas Herman, San Jose, CA (US); Zhanhe Shi, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 105 days.

(21) Appl. No.: 16/258,153

(22) Filed: Jan. 25, 2019

(51) Int. Cl.
*G06F 1/26* (2006.01)
*G06F 13/362* (2006.01)
*G06F 30/34* (2020.01)

(52) U.S. Cl.
CPC ............ *G06F 1/266* (2013.01); *G06F 13/362* (2013.01); *G06F 30/34* (2020.01)

(58) Field of Classification Search
CPC ......... G06F 1/266; G06F 30/34; G06F 13/362
See application file for complete search history.

(56) References Cited

U.S. PATENT DOCUMENTS

| | | | | |
|---|---|---|---|---|
| 5,705,938 | A * | 1/1998 | Kean | H03K 19/17704 326/39 |
| 6,710,621 | B2 * | 3/2004 | Devlin | G06F 1/26 326/38 |
| 7,017,140 | B2 * | 3/2006 | Haji-Aghajani | G06F 30/34 716/138 |
| 7,076,595 | B1 * | 7/2006 | Dao | G06F 15/7867 710/100 |
| 7,116,130 | B2 * | 10/2006 | Liu | G06F 30/34 326/38 |
| 7,421,605 | B2 * | 9/2008 | Balasubramanian | H03K 17/687 713/300 |
| 7,692,448 | B2 * | 4/2010 | Solomon | G06F 30/34 326/38 |
| 8,683,163 | B2 * | 3/2014 | Morfey | G06F 1/24 711/167 |
| 9,294,094 | B1 | 3/2016 | Ramabadran | |
| 9,405,877 | B1 | 8/2016 | Ramabadran | |
| 9,495,492 | B1 | 11/2016 | Ramabadran | |
| 9,645,898 | B2 * | 5/2017 | Kidamura | G06F 11/1604 |
| 10,387,600 | B2 * | 8/2019 | Dudha | G06F 30/30 |
| 2009/0251867 | A1 * | 10/2009 | Sharma | H04Q 1/08 361/737 |

* cited by examiner

*Primary Examiner* — Naum Levin
(74) *Attorney, Agent, or Firm* — Vista IP Law Group, LLP

(57) ABSTRACT

A method includes programming an FPGA based controller of a master blade with a power scheme. The master blade receives a first power management signal from the master blade and slave blades. The master blade transmits a second power management signal to itself and to the slave blades responsive to the first power management signal. The master blade receives a third power management signal from itself and the slave blades. The power scheme controls an order and delay in which the second power management signal is transmitted to the first master blade and the slave blades. The power scheme controls an order and delay in which the third power management signal is received from the master blade and the slave blades. The system can be expanded by connecting the master blades to a grand master blade and multiple grand master blades to a great grand master blade.

20 Claims, 10 Drawing Sheets

MULTI-MODAL POWER CONTROL

TECHNICAL FIELD

Embodiments described herein are generally related to the field of circuit emulation in circuit modeling and fabrication. More specifically, embodiments described herein are related to power management in circuit emulators (e.g., a prototyping system) including a large number of field-programmable gate arrays (FPGAs) configured to emulate multiple netlists in one or more integrated circuit designs.

BACKGROUND

Designers of integrated circuit devices ("chips"), generally application-specific integrated circuits ("ASICs"), use prototyping as part of the electronic design automation process prior to manufacture of the chip. Prototyping is one type of hardware-based functional verification that allows the circuit designer to observe the behavior of the circuit design under conditions approximating its final, manufactured performance. During prototyping, a circuit design, generally written in register transfer language ("RTL") code, is programmed into one or more programmable integrated circuits, frequently field-programmable gate arrays ("FPGA") on a prototyping board. FPGA-based prototypes are a fully functional representation of the circuit design, its circuit board, and its input/output ("I/O") devices. Also, FPGA prototypes generally run at speeds much closer to the clock speed at which the manufactured chip will run than other types of functional verification, e.g., software simulation, thereby allowing for verifying the circuit design under many more conditions in the same amount of time than other verification methods, and in particular, software simulation. The circuit design prototype may also be operated in another electronic circuit, e.g., the electronic circuit for which the design under verification will be used after fabrication, so that the circuit design prototype may be observed and tested in an environment in which the manufactured chip will be used. As such, circuit designers may use FPGA prototyping as a vehicle for software co-development and validation, increasing the speed and accuracy of system developments.

Prototyping of a circuit design using programmable integrated circuits (e.g., FPGAs) can have advantages over other types of functional verification, namely emulation using a plurality of emulation processors. First, prototyping using programmable integrated circuits generally results in higher speed relative to emulation using emulation processors. Second, such higher-speed circuit design prototypes using programmable integrated circuits can sometimes even run in real-time, that is, the prototype may run at the intended clock speed of the manufactured chip, rather than a reduced clock speed. This is not always the case, notably for higher performance circuit designs that have clock speeds higher than the maximum allowed by the programmable integrated circuits. Third, such prototyping systems using programmable integrated circuits are generally of lower cost than an emulation system using processors An FPGA often has less logical capacity than required to implement the circuit design, and thus the number of logic gates available in the FPGA are insufficient to program in all the logic of the circuit design. Thus, the current state of FPGA technology does not allow the entirety of the logic of a single ASIC to be prototyped within a single FPGA. This may be overcome by mapping/partitioning the logic of the large circuit design to multiple FPGAs on a prototyping system. The power distribution to multiple FPGAs needs to be controlled based on the partitions and their inter-dependency relationship. Existing power management uses software to control the power distribution to the FPGAs. However, the software based methods are not able to provide precise control of the delays in providing power to the different FPGAs and order in which the power is provided, resulting in complicated synchronization between the FPGAs and longer emulation run time. Further, the software based methods are limited to a small number of FPGAs, do not scale to thousands of FPGAs or beyond to meet the chip density growth. This requires new methods of managing power in the prototyping system.

The description provided in the background section should not be assumed to be prior art merely because it is mentioned in or associated with the background section. The background section may include information that describes one or more aspects of the subject technology.

SUMMARY

In a first embodiment, a computer-implemented method is described that includes programming a Field Programmable Gate Array (FPGA) based controller of a master blade with a power scheme, wherein the master blade is connected to one or more slave blades, receiving, using the FPGA based controller of the master blade, a first power management signal from the master blade and one or more slave blades, wherein the master blade and the one or more slave blades operate in a first mode of operation, transmitting, using the FPGA based controller and based on the power scheme, a second power management signal from the master blade to the master blade and to the one or more slave blades in response to the first power management signal, the master blade and the one or more slave blades operating in a second mode of operation in response to the second power management signal, and receiving, using the FPGA based controller and based on the power scheme, a third power management signal from the master blade and the one or more slave blades, wherein the third management signal is received in response to the second power management signal and is indicative of the master blade and the one or more slave blades operating in the second mode of operation. The power scheme controls an order in which the second power management signal is transmitted to the master blade and the one or more slave blades and delays between transmitting the second power management signal to the master blade and the one or more slave blades.

In another embodiment, a system is described, the system including a first master blade connected to one or more first slave blades, the first master blade and the one or more first slave blades each including a first Field Programmable Gate Array (FPGA) based controller programmed with a first power scheme, a memory storing instructions, and a processor communicably coupled to the first master blade and configured to execute the instructions. The instructions directing the first master blade to receive, using the first FPGA based controller of the first master blade and based on the first power scheme, a first power management signal from the first master blade and one or more first slave blades, wherein the first master blade and the one or more first slave blades operate in a first mode of operation, transmit, using the first FPGA based controller of the first master blade and based on the first power scheme, a second power management signal from the first master blade to the first master blade and the one or more first slave blades in response to the first power management signal, the first master blade and the one or more first slave blades operating in a second mode of operation in response to the second power management signal, and receive, using the first FPGA based controller of the first master blade and based on the first power scheme, a third power management signal from the first master blade and the one or more first slave blades, wherein the third management signal is received in response to the second power management signal and is indicative of the first master blade and the one or more first slave blades operating in the second mode of operation. The power scheme controls an order in which the second power management signal is transmitted to the master blade and the one or more slave blades and delays between transmitting the second power management signal to the master blade and the one or more slave blades. In an embodiment, N (where N>1) master blades may be connected to another master blade, resulting in the scale of the number of programmable logic devices in the master blade and the one or more slave blades to be increased by N times. Further, M (where M>1) of the another master blades may be connected to a yet another master blade to increase the scale of the number of programmable logic devices by N×M times.

In yet another embodiment, a non-transitory, computer-readable medium is described that includes machine-readable instructions that direct a processor communicably connected to a master blade to perform a method. The master blade includes a Field Programmable Gate Array (FPGA) based controller programmed with a power scheme and connected to one or more slave blades. The method includes receiving, using the FPGA based controller of the master blade and based on the power scheme, a first power management signal from the master blade and one or more slave blades, wherein the master blade and the one or more slave blades operate in a first mode of operation, transmitting, using the FPGA based controller of the master blade and based on the power scheme, a second power management signal from the master blade to the master blade and the one or more slave blades in response to the first power management signal, the master blade and the one or more slave blades operating in a second mode of operation in response to the second power management signal, and receiving, using the FPGA based controller of the master blade and based on the power scheme, a third power management signal from the master blade and the one or more slave blades, wherein the third management signal is received in response to the second power management signal and is indicative of the master blade and the one or more slave blades operating in the second mode of operation. The power scheme controls an order in which the second power management signal is transmitted to the master blade and the one or more slave blades and delays between transmitting the second power management signal to the master blade and the one or more slave blades.

In a further embodiment, a system is described that includes a means for programming a Field Programmable Gate Array (FPGA) based controller of a master blade with a power scheme, wherein the master blade is connected to one or more slave blades, means for receiving, using the FPGA based controller of the master blade, a first power management signal from the master blade and one or more slave blades, wherein the master blade and the one or more slave blades operate in a first mode of operation, means for transmitting, using the FPGA based controller and based on the power scheme, a second power management signal from the master blade to the master blade and to the one or more slave blades in response to the first power management signal, the master blade and the one or more slave blades operating in a second mode of operation in response to the second power management signal, and means for receiving, using the FPGA based controller and based on the power scheme, a third power management signal from the master blade and the one or more slave blades, wherein the third management signal is received in response to the second power management signal and is indicative of the master blade and the one or more slave blades operating in the second mode of operation. The power scheme controls an order in which the second power management signal is transmitted to the master blade and the one or more slave blades and delays between transmitting the second power management signal to the master blade and the one or more slave blades.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
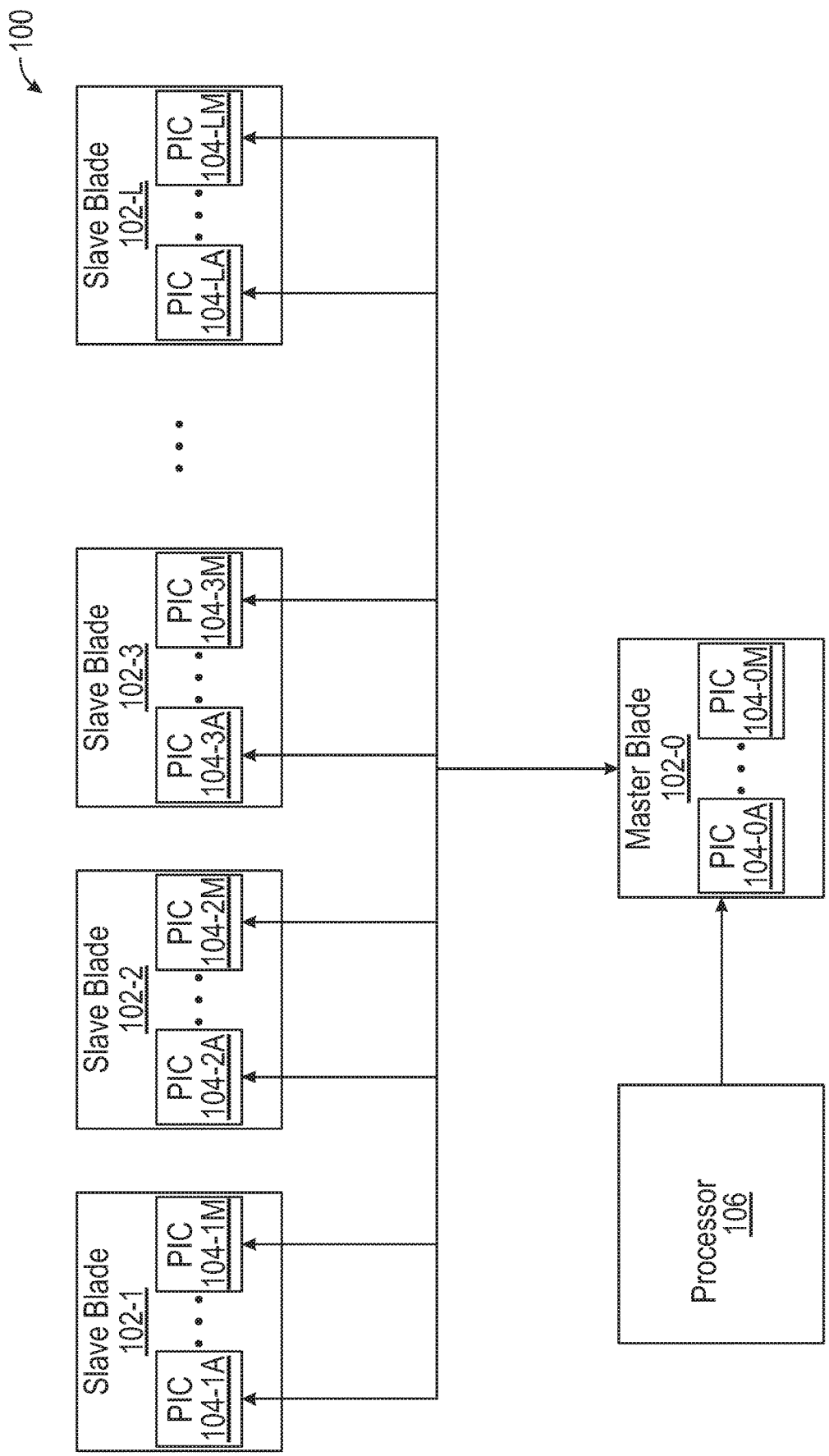
FIG. 1 illustrates an example prototyping system.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Embodiments as disclosed herein address the problem of managing power distribution in a circuit architecture that includes one or more prototyping systems each including multiple programmable integrated devices, e.g., Field Programmable Gate Arrays (FPGAs). Embodiments disclosed herein provide an improvement to the functionality of prototyping systems by precisely controlling the order and delay in which power is provided in the prototyping systems when an emulation is executed on multiple prototyping systems. By controlling the order and delay, the synchronization between emulation modules across different prototyping systems can be simplified and the emulation run time can be improved. The embodiments can also scale the power distribution and control to unlimited number of such prototyping systems to meet the needs of fast increasing chip densities.

Prototyping systems typically include a plurality of blades, each of which includes multiple programmable integrated circuits. The blades include a master blade connected to multiple slave blades to increase the number of programmable integrated circuits available for emulating the circuit design. Each of the blades include a hardware based controller, for example, a controller implemented on an FPGA, that controls the power distribution in the prototyping system. In some embodiments, the power distribution to the different blades is performed based on a predetermined order and delay. Compared to existing software based solutions, a pure hardware based solution (e.g., using a controller implemented in an FPGA) according to example embodiments simplifies the emulation logic, further improves the emulation run time. Additionally, by using a hardware based solution, the order in which power is provided to the blades and the delays between the different power management signals can be controlled with a sub-microsecond resolution. In contrast, a software based solution can only provide a resolution of seconds. The prototyping systems can be expanded to include multiple levels (hierarchies) of master and slave blades to further increase the number of programmable integrated circuits. By employing the hardware based solution, according to example embodiments disclosed, an increased number of (theoretically infinite) levels of master and slave blades can be obtained to implement even larger circuit designs in the future. In comparison, a software based solution can provide only a limited levels of master and slave blades, and is thus not "future-proof."

FIG. 1 illustrates an example prototyping system 100. As shown in FIG. 1, prototyping system 100 may include multiple blades 102-0-102-L (collectively, blades 102). In an example configuration, the blade 102-0 may be considered as a master blade, and blades 102-1-102-L can be considered as slave blades. As discussed below, the master blade 102-0 is programmed to control the power distribution to the slave blades 102-0-102-L. Blades 102 may be server modules that are arranged in chassis, such as server racks, such that each chassis may house a plurality of blades. For example, blades 102 may be housed in a single chassis or amongst a plurality of chassis in prototyping system 100.

Prototyping system 100 further includes programmable integrated devices 104 which, for example may be field programmable gate arrays (FPGAs). As shown in FIG. 1, each blade 102 may include a plurality of programmable integrated devices 104. For example and as illustrated, the master blade 102-0 includes programmable integrated devices 104-0A through 104-0M, slave blade 102-1 includes programmable integrated devices 104-1A through 104-1M, blade 102-2 includes programmable integrated devices 104-2A through 104-2M, and so on. Thus, it will be understood that each blade 102 has a similar configuration. Depending on the programming and/or the connections between the blades 102, one of the blades 102 functions as a master blade and the remaining blades 102 function as slave blades.

Each blade 102 includes a power control module (or logic), which may be implemented in hardware, software, or combination thereof. The power control module may be a set of computer readable instructions, such as firmware, that may be executed to program the master blade 102-0 to send instructions (or signals) to control the power distribution to the slave blades 102-1-102-L and to itself. In an example, the power control module may be implemented using a programmable logic device, e.g., a power controller implemented using an FPGA 203 (FIG. 2), on the blades 102 and functions as a power controller.

A processor 106 may be operably coupled to the master blade 102-0 to program the power controller FPGA of the master blade 102-0 and control the operation of the master blade 102-0. The processor 106 may also be connected to the slave blades 102-1-102-L to program the power controller FPGAs on the slave blades 102-1-102-L and control the operation of the slave blades 102-1-102-L. Alternatively, each blade 102 may be connected to an individual processor.

Figure 2:
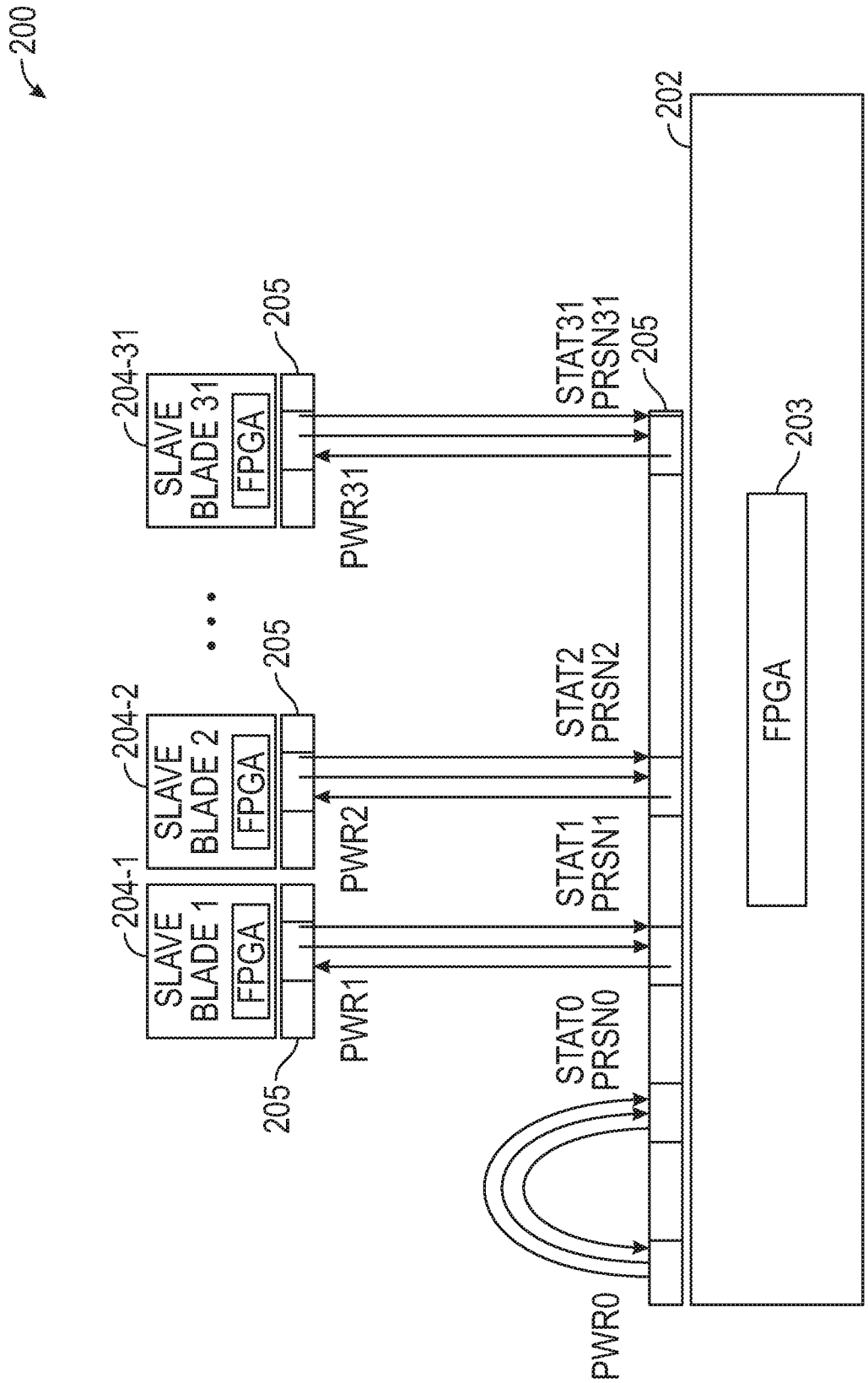
FIG. 2 illustrates a system including a master blade connected to multiple slave blades, according to some embodiments.

FIG. 2 illustrates a system 200 including a master blade 202 connected to multiple slave blades 204-1-204-31, according to some embodiments. The master blade 202 may be similar to the master blade 102-0 in FIG. 1 and may be operably coupled to a processor (e.g., processor 106, FIG. 1) to program the power controller FPGA 203 and control the operation of the master blade 202. As illustrated, the master blade 202 is connected to thirty one slave blades 204-1-204-31 (collectively, slave blades 204). The master blade 202 is connected to each slave blade 204 via power management signals. In an embodiment, the power management signals include a power control signal PWR, a power status signal STAT, and a presence signal PRSN. Thus, master blade 202 is connected to slave blade 204-1 via power control signal PWR1, power status signal STAT1, and presence signal PRSN1. The master blade 202 is connected to slave blade 204-2 via power control signal PWR2, power status signal STAT2, and presence signal PRSN2, and so on.

In addition, each of the three signals the power control signal PWR, the power status signal STAT, and the presence signal PRSN are connected between an output control port of the master blade 202 and an input control port of the master blade 202. As illustrated, the power control signal PWR0, the power status signal STAT0, and the presence signal PRSN0 are connected between the output control port of the master blade 202 and an input control port of the master blade 202. Such a connection is referred to as a loopback connection, and is always included on the master blade 202. By way of this connection, the master blade 202 is also included in the overall power control of the system 200. As mentioned above, the master blades and the slave blades are similar to each other, and this loopback connection differentiates the master blade 202 from the slave blades 204 in the system 200.

The power control signal PWR is transmitted from the master blade 202 to each slave blade 204 and to itself, and instructs a slave blade 204 and the master blade 202 to turn ON a main power supplied thereto. The slave blade 204 and the master blade 202 acknowledge that the main power has been turned ON by transmitting the power status signal STAT to the master blade 202. The presence signal PRSN is transmitted from a slave blade 204 to the master blade 202 to indicate that the slave blade 204 is connected to the master blade 202. In an embodiment, the power control signal PWR, the power status signal STAT, and the presence signal PRSN are provided using a mini-Serial Attached SCSI HD (MSHD) cable that is coupled to the MSHD connectors 205 on the master blade 202 and the slave blades 204. As used herein, transmitting a signal includes asserting or changing the logic level of the signal by the transmitting device to a predetermined logic level that is recognized by the recipient device to perform a predetermined action or that is indicative of predetermined status of the transmitting device. The change in logic level can be from logic HIGH to logic LOW or from logic LOW to logic HIGH. Accordingly, in transmitting the power control signal PWR, the master blade 202 changes the logic level of the power control signal PWR to logic high which the slave blades 204 and the master blade 202 itself recognize as an indication to turn ON the main power. However, in other embodiments, the power control signal PWR can be changed from logic HIGH to logic LOW, which the slave blades 204 and the master blade 202 recognize as an indication to turn ON the main power. Likewise, logic levels of the presence signal PRSN and power status signal STAT can be set to a logic HIGH or logic LOW levels to perform the related action(s) or to indicate a predetermined status.

Referring to FIG. 2, power control using the power control module, according to example embodiments disclosed, is generally performed in two modes of operation, a standby power mode of operation and a main power mode of operation. In the standby mode, only a minimal number of components on the master blade 202 and the slave blades 204 are provided power (also referred to as standby power). For instance, when the system 200 plugged into a source of system power, e.g., a wall outlet, the system 200 enters the standby power mode of operation wherein power is provided to the power controller including the power control module and a certain pre-determined devices on the master blade 202 and the slave blades 204. Devices on the master blade 202 and the slave blades 204 that consume relatively higher power (e.g., the programmable integrated devices 104 (FIG. 1)) are not provided the system power in the standby mode. After the master blade 202 and the slave blades 204 are powered on in the standby mode, each slave blade 204 transmits its presence signal PRSN to the master blade 202 to indicate a connection between the master blade 202 and the slave blade 204. For instance, presence signals PRSN1, PRSN2, . . . , PRSN31 are transmitted by respective slave blades 204-1, 204-2, . . . , 204-31 to the master blade 202. The master blade 202 also transmits a presence signal PRSN0 to itself (loopback connection).

When it is desired to provide main power to the master blade 202 and the slave blades 204, the master blade 202 sends the power control signal PWR to the slave blades 204 from which the corresponding presence signal PRSN has been received. The master blade 202 also sends the power signal PWR to itself. For instance, the master blade 202 sends the power control signals PWR1, PWR2 . . . PWR31 to the corresponding slave blades 204-1, 204-2, . . . , 204-31. The master blade 202 send the power control signal PWR0 to itself (loopback connection). The master blade 202 and the slave blades 204 turn on the main power to all the devices on the master blade 202 and the slave blades 204. Once the main power has been turned on, the slave blades 204 send the power status signal STAT to the master blade 202. For instance, each slave blade 204 transmits power status signals STAT1, STAT2, . . . , STAT31 to the master blade 202. The master blade 202 also transmits power status signal STAT0 to itself (loopback connection). Thus, the master blade 202 receives an indication from all slave blades 204 and from itself that power has been supplied to all devices on the master blade 202 and the slave blades 204. Thus, it will be understood that the master blade 202 sends the power signal PWR only to the slave blades 204 from which the presence signal PRSN has been received. Similarly, the master blade 202 send the power signal PWR to itself. By transmitting the power signal PWR only to the blades from which the presence signal PRSN has been received, the main power is not provided to all the blades and the overall power consumption in the main power mode of operation is reduced.

Figure 3:
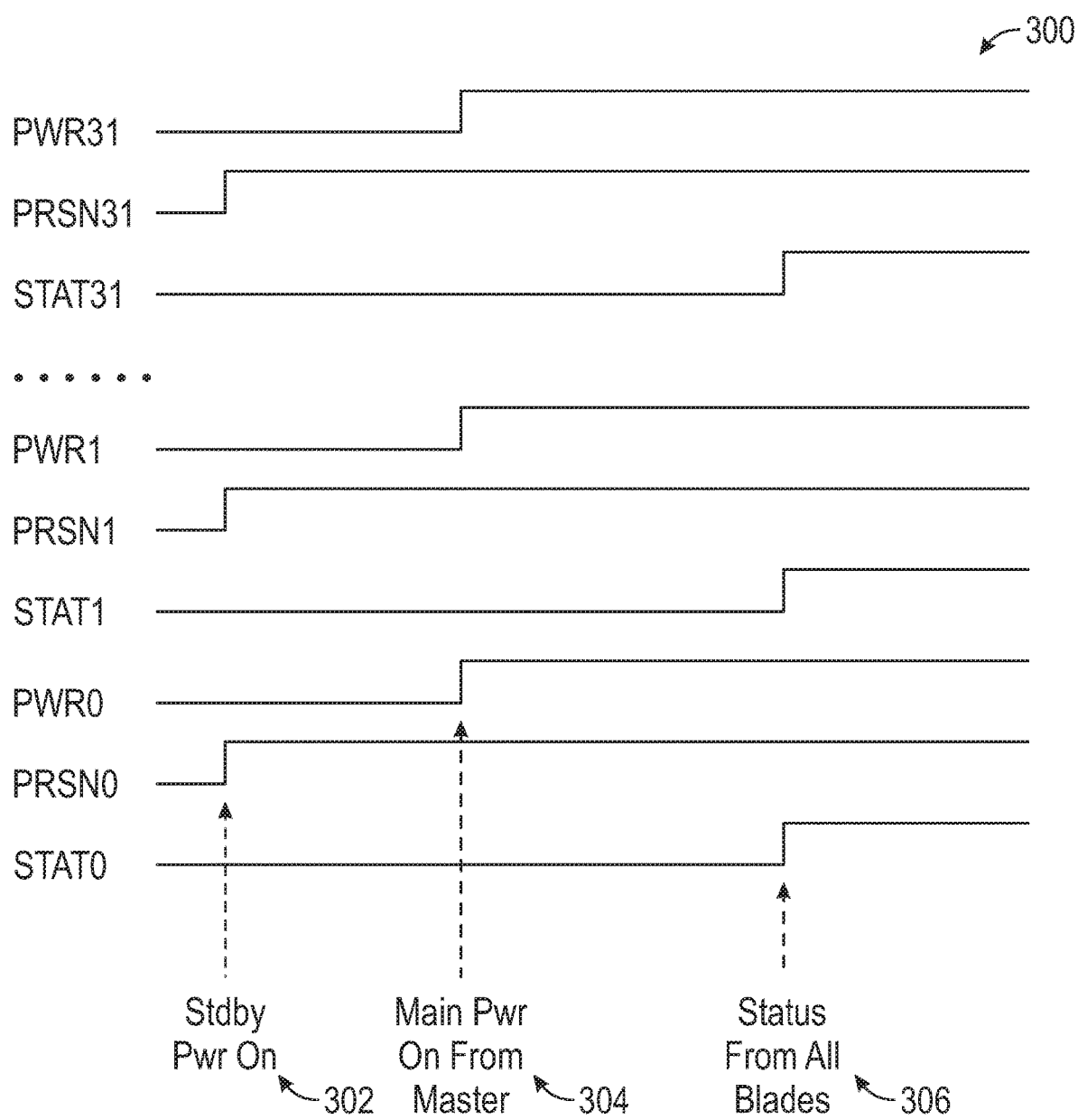
FIG. 3 is a timing diagram illustrating the power ON cycle of the power control process, according to example embodiments.

FIG. 3 is a timing diagram 300 illustrating the power ON cycle of the power control process, according to example embodiments. As illustrated, and with continued reference to FIG. 2, at 302, each slave blade 204 transmits (indicated by logic HIGH level) its presence signals PRSN[1:31] to the master blade 202 to indicate a connection to the master blade 202. Additionally, the master blade 202 and the slave blades 204 enter the standby power mode of operation (when connected to a power source) under control of the power control module in the power controller FPGA 203 on the slave blades 204. At 304, the master blade 202 transmits power control signals PWR[1:31] to the slave blades 204 from which the corresponding presence signal PRSN has been received and also transmits power control signal PWR0 to itself, as illustrated. At 306, the master blade 202 receives power status signals STAT[1:31] from the slave blades 204 to which the power signal PWR has been transmitted and also receives power status signal STAT0 from itself.

Figure 4:
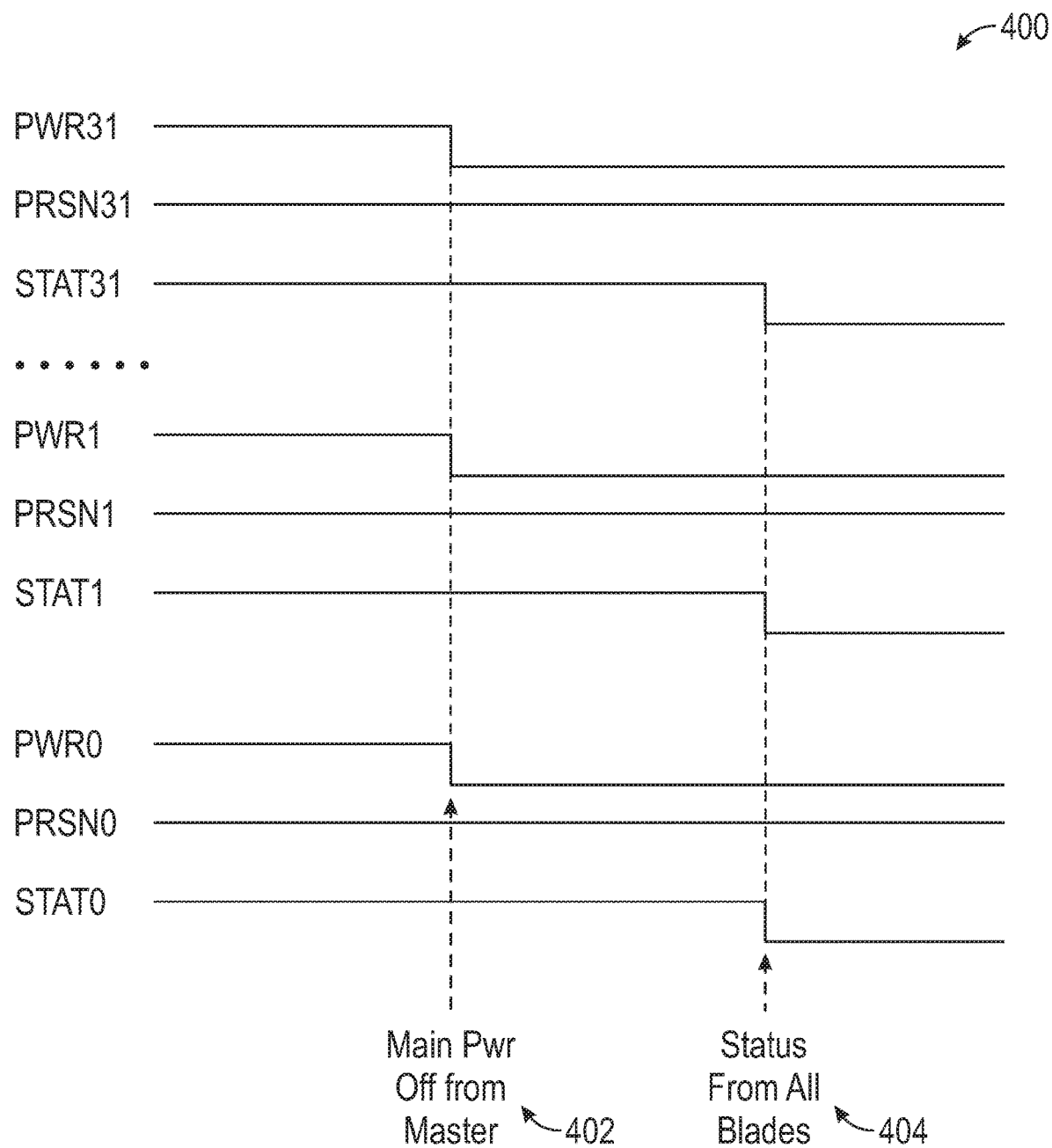
FIG. 4 is a timing diagram illustrating the power OFF cycle of the power control process, according to example embodiments.

FIG. 4 is a timing diagram 400 illustrating the power OFF cycle of the power control process, according to example embodiments. The power OFF cycle is somewhat reverse of the power ON cycle. As illustrated, and with continued reference to FIG. 2, at 402, the master blade 202 deactivates (or de-asserts, indicated by logic low) power control signals PWR[1:31] to the slave blades 204 and also deactivates power control signal PWR0 to itself. In turn, at 404, the power status signals STAT[1:31] from the master blade 202 to the slave blades 204 are deactivated. Also, the power status signal STAT0 from the master 202 to itself is deactivated. When the power control signals PWR[1:31] are deactivated, the master blade 202 and the slave blades 204 operate in the standby mode, and this is indicated by deactivating the power status signals STAT[1:31]. Standby power to the master blade 202 and the slave blades 204 remains ON and this is indicated by the logic HIGH level of the presence signals PRSN[1:31] from the slave blades 204 to the master blade 202, and from the master blade 202 to itself. As used herein, deactivating or de-asserting a signal includes changing a logic level of the signal to a logic level that is opposite of the logic level at which the signal was transmitted or asserted. Accordingly, deactivating or de-asserting the signal causes or directs the recipient device to stop performing an action or indicates to the recipient device a different status or state of the transmitting device.

In an example embodiment, main power can be provided to the master blade 202 and the slave blades 204 in a desired order instead of providing the main power to all the master blade 202 and the slave blades 204 simultaneously or at around the same time (e.g., within an acceptable margin).

Figure 5:
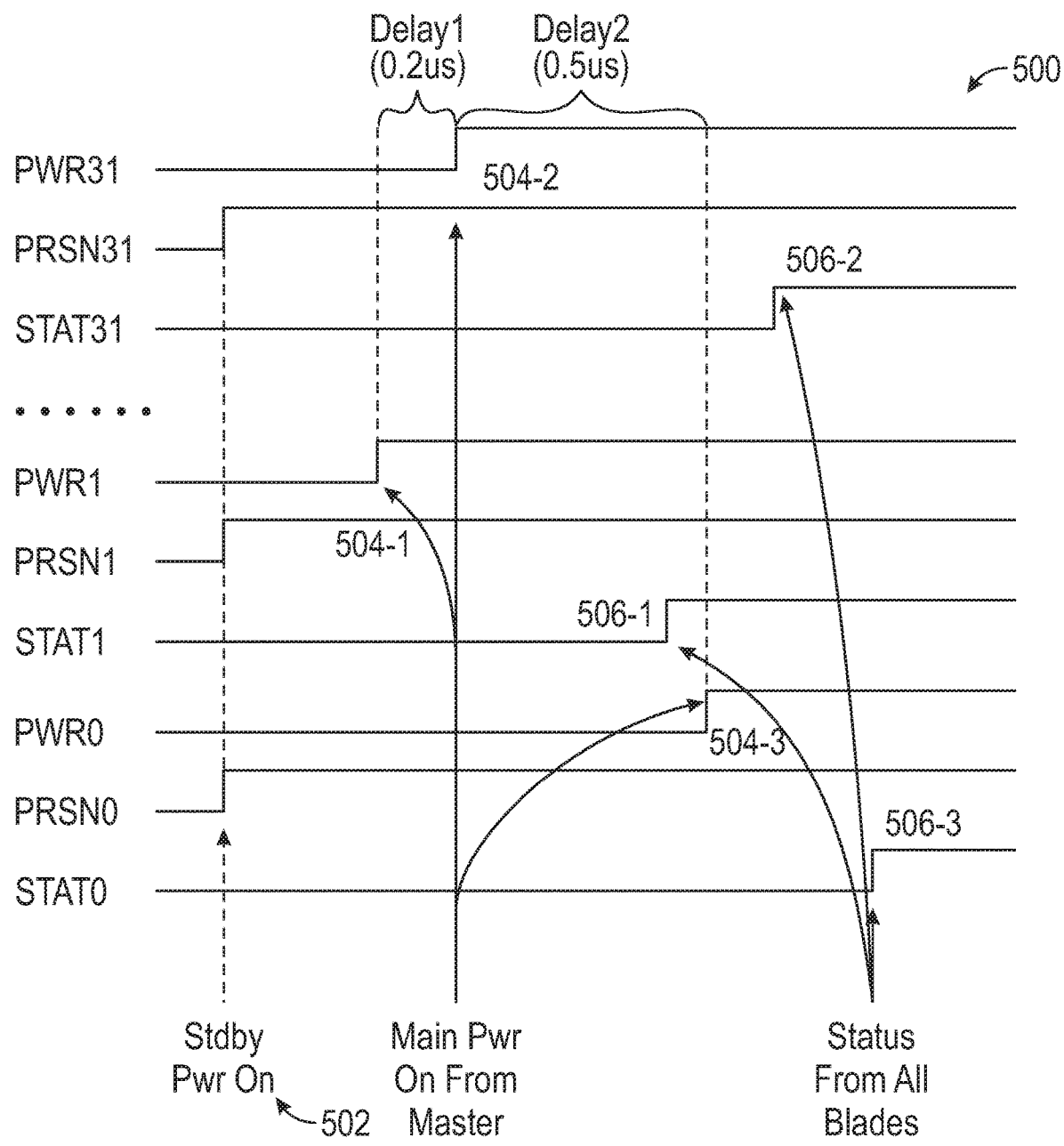
FIG. 5 is a timing diagram illustrating the power ON cycle of the power control process in which main power is provided to the master blade in FIG. 2 and the slave blades in FIG. 2 in a desired order, according to example embodiments.

FIG. 5 is a timing diagram 500 illustrating the power ON cycle of the power control process in which main power is provided to the master blade 202 and the slave blades 204 in a desired order, according to example embodiments. As illustrated, and with continued reference to FIG. 2, at 502, standby power is turned on (e.g., by plugging the system to wall power outlet) and each slave blade 204 transmits (or asserts, indicated by logic HIGH level) its presence signals PRSN[1:31] to the master blade 202 indicating the blade is connected to the master blade 202, and the master blade 202 also transmits a presence signal PRSN0 to itself indicating the loopback connection. The master blade 202 then instructs main power to be turned on for the master blade 202 and the slave blades 204 by transmitting power control signals PWR[1:31] to the slave blades 204 and the power control signal PWR0 to itself. The power control module configures the master blade 202 to transmit the power control signals PWR[0:31] in a desired order with delays between the different power control signals PWR[0:31] transmitted to the master blade 202 and the slave blades 204. For instance, as illustrated in FIG. 5, power control signal PWR1 is first transmitted to slave 204-1, as at 504-1. The power control signal PWR31 is then transmitted to slave 204-31 after a delay of around 0.2 µs, as at 504-2. The power control signal PWR0 is then transmitted to master 202 after a delay of around 0.5 µs after transmitting the power control signal PWR31, as at 504-3. The power control signals PWR are transmitted with a precise delay with sub-microsecond resolution, as opposed to existing methods. Once the main power has been turned on, the master blade 202 and the slave blades 204 send the respective power status signals STAT [0:31] to the master blade 202. For instance, as illustrated, the slave blade 204-1 transmits power status signal STAT1 to master blade 202, at 506-1, in response to the main power to the slave blade 204-1 being turned on. Similarly, the slave blade 204-31 transmits power status signal STAT31 to master blade 202, at 506-2, in response to the main power to the slave blade 204-31 being turned on. The master blade 202 transmits power status signal STAT0 to master blade 202, at 506-3, in response to the main power to the master blade 202 being turned on. Standby power to the master blade 202 and the slave blades 204 remains ON and this is indicated by the logic HIGH level of the presence signals PRSN[1:31] from the slave blades 204 to the master blade 202, and from the master blade 202 to itself.

The order and delays with which the power control signals are transmitted is dependent on the interdependency and timing relationship between the emulations running on the blades. For instance, if an emulation running on slave blade 204-1 provides a result to an emulation running on slave blade 204-5, then the slave blade 204-1 has to be provided main power before slave blade 204-5. Further, the order and delays are user-programmable. As a result, the synchronization between emulation modules across different blades is simplified by controlling the order and delay in which power is provided to the connected blades. By controlling the order and delay, the speed of emulation can be improved.

In an example embodiment, main power can be turned off to the master blade 202 and the slave blades 204 in a desired order instead of turning off the main power to all the master blade 202 and the slave blades 204 simultaneously or at around the same time (e.g., within an acceptable margin).

Figure 6:
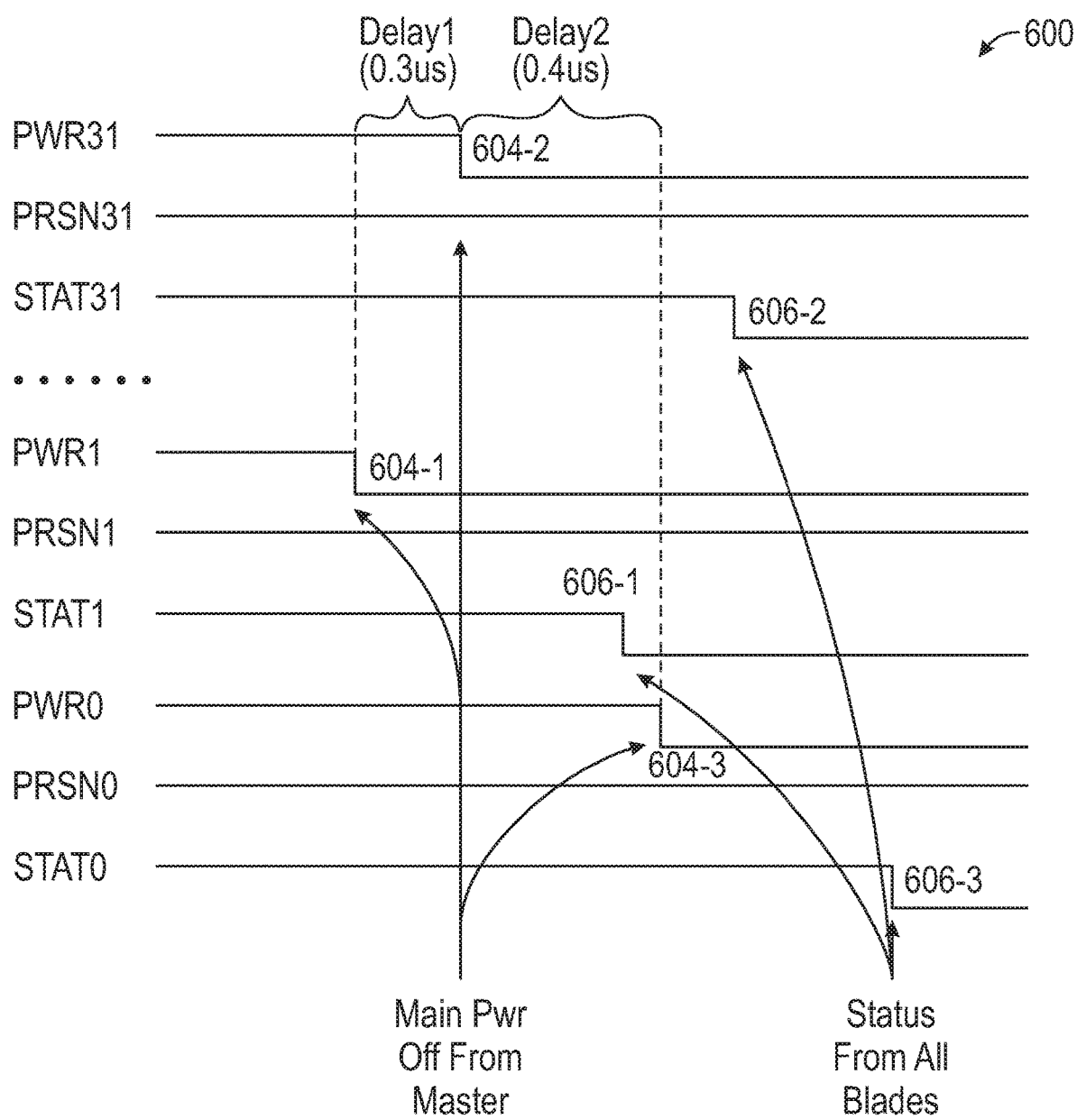
FIG. 6 is a timing diagram illustrating the power OFF cycle of the power control process in which main power is turned off to the master blade in FIG. 2 and the slave blades in FIG. 2 in a desired order, according to example embodiments.

FIG. 6 is a timing diagram 600 illustrating the power OFF cycle of the power control process in which main power is turned off to the master blade 202 and the slave blades 204 in a desired order, according to example embodiments. The power control module configures the master blade 202 to deactivate the power control signals PWR[0:31] in a desired order with delays between the different power control signals PWR[0:31] deactivated from the master blade 202 and the slave blades 204. For instance, as illustrated in FIG. 6, and with continued reference to FIG. 2, power control signal PWR1 is first deactivated from slave 204-1, as at 604-1. The power control signal PWR31 is then deactivated from slave 204-31 after a delay of around 0.3 µs, as at 604-2. The power control signal PWR0 is then deactivated from the master 202 after a delay of around 0.4 µs, as at 604-3. Once the main power has been turned off, the master blade 202 and the slave blades 204 send the respective power status signals STAT[0:31] to the master blade 202. For instance, as illustrated, the slave blade 204-1 deactivates power status signal STAT1 provided to the master blade 202, at 606-1, in response to the main power to the slave blade 204-1 being turned off. Similarly, the slave blade 204-31 deactivates the power status signal STAT31 provided to the master blade 202, at 606-2, in response to the main power to the slave blade 204-31 being turned off. The master blade 202 transmits power status signal STAT0 to master blade 202, at 606-3, in response to the main power to the master blade 202 being turned off.

The order and delays with which the power control signals are deactivated is dependent on the interdependency and timing relationship between the emulations running on the blades. For instance, if an emulation running on slave blade 204-1 provides a result to an emulation running on slave blade 204-5, then the slave blade 204-1 has to be turned off before slave blade 204-5. However, the order in which the blades are turned off may not be the reverse of the order in which the blades were turned on. The order in which the blades are turned off is thus independent of the order in which the blades are turned on, as long as the interdependency between the emulations is accounted for. Further, the order and delays are user-programmable.

According to example embodiments, one or more slave blades 204 can be set into a local override mode. In the local override mode, the slave blade 204 does not participate in the power on/off cycles discussed above. In an embodiment, the local override mode can be activated individually on each slave blade 204 by turning on a local override switch on the slave blade 204. In other embodiments, a slave blade 204 can be set in local override mode via software. When in the local override mode, the power control signal PWR from the master blade 202 to the slave blade 204 is ignored, and the power status signal STAT and the presence signal PRSN are always off (e.g., logic low level). When in the local override mode, the power control in the slave blade 204 is performed using the local power control logic implemented in the power controller FPGA 203 of the slave blade 204. It should be noted that the slave blade 204 in the local override mode will still be provided the standby power. The main power is not provided to the slave blade 204 since the power control signal PWR from the master blade 202 is ignored by the power control module in the slave blade 204. As an example, the local override mode is helpful when a maintenance operation (e.g., debugging, replacing, etc.) is to be performed on the slave blade 204. Using the local override mode, individual the slave blade(s) can be serviced without disconnecting power to the entire system.

According to example embodiments, power to one or more slave blades 204 can be individually controlled. In this individual mode of power control, the power control signal PWR from the master blade 202 to a slave blade 204 can be activated/deactivated (asserted/de-asserted) independent of the other slave blades 204. The slave blade 204 can thus be individually powered on/off without affecting the rest of the slave blades connected to the master blade 202. In the embodiment in which main power is provided to the slave blades 204 in the desired order, the order in which the power control signal PWR is transmitted or deactivated cannot be interrupted once the power cycle has been initiated. Thus, all blades are either provided with the power control signal PWR or the power control signal PWR is deactivated from all slaves. In contrast, in the individual mode of power control, the power control signal PWR can be individually provided to or deactivated from the slave blades 204.

According to example embodiments, a subset of slave blades 204 connected to the master blade 202 can be formed into a group and the master blade 202 can provide power control the group. A subset of slave blades 204 can include one or more slave blades 204. In the group mode of power control, the slave blades 204 in a group can be powered on/off independent of the other slave blades 204 connected to the master blade 202. Within a group, the desired order and delays with which the power control signal(s) PWR are transmitted to or deactivated from the slave blades 204 in the group can be programmed separately from the order and delay with which of the power control signal(s) PWR are transmitted to or deactivated from other slave blades 204 connected to the same master blade 202. The order and delays with which the power control signals are transmitted or deactivated from slave blades 204 in a group is dependent on the interdependency and timing relationship between the emulations running on the blades in the group. Multiple groups of slave blades 204 can co-exist under the same master blade 202. This mode of power control is useful for controlling power to sub-modules of a large emulation that utilizes multiple programmable logic devices in the system.

Referring to FIG. 2, the system 200 can be expanded to increase the number of blades for emulating even larger circuit designs. For instance, multiple master blades 202 can each be connected to another master blade 202 to support a bigger emulation that requires more than thirty two slave blades.

Figure 7:
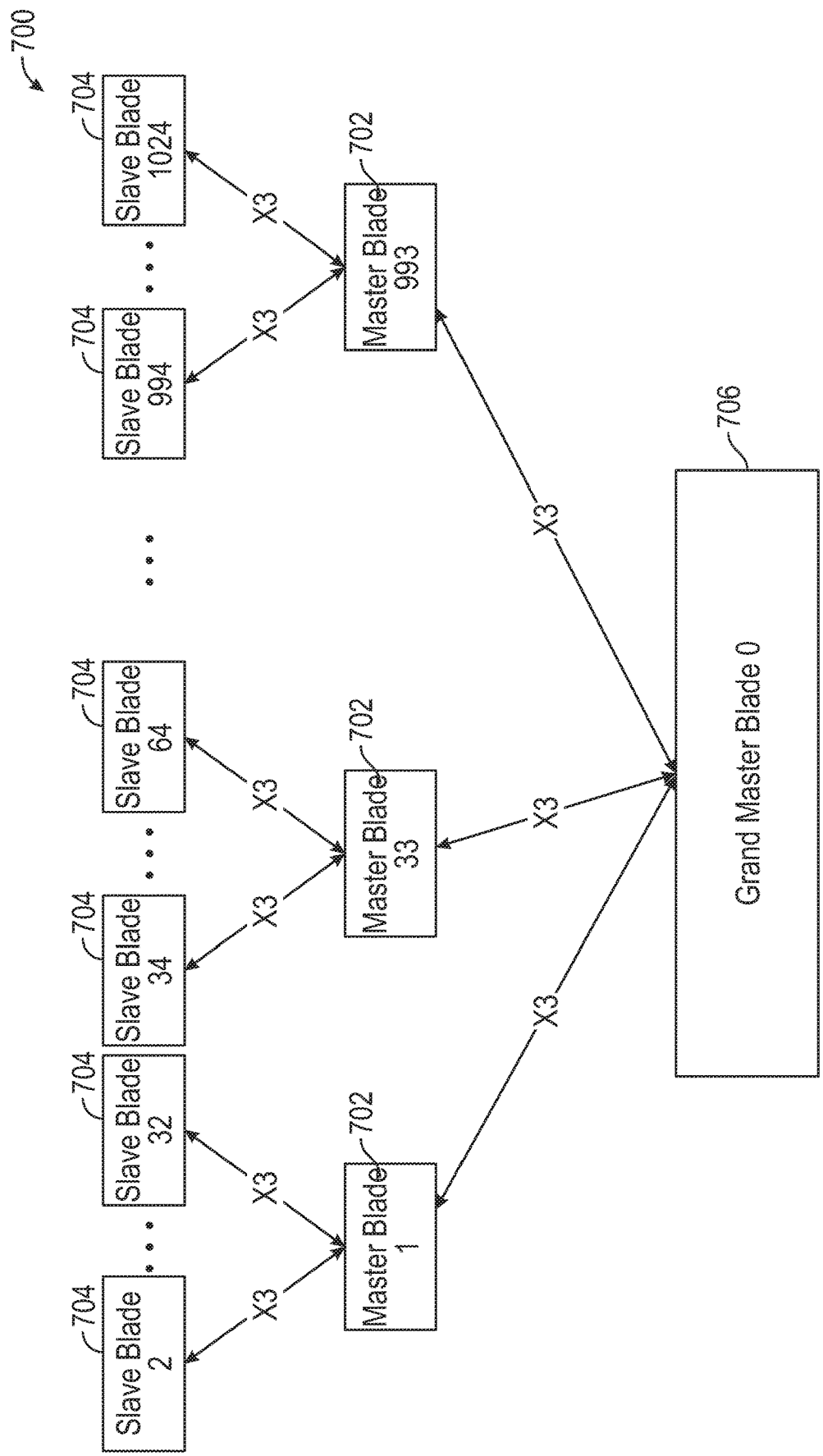
FIG. 7 illustrates a cascaded system including multiple slave blades connected to corresponding master blades which in turn are connected to another master blade.

FIG. 7 illustrates a system 700 including 1024 slave blades 704 connected to corresponding master blades 702 (referred to as secondary master blades) which in turn are connected to another master blade 706 (referred to as a grand master blade). As a result, the number of programmable logic devices (e.g., programmable integrated devices 104, FIG. 1) in the system 700 for emulating a circuit design are increased. As illustrated, the system 700 supports a total of 1024 blades including master blades 702 and slave blades 704. More levels (or hierarchies) of master blades and slave blades can be added to further increase the number of blades, and thereby the number of programmable logic devices (e.g., programmable integrated devices 104, FIG. 1). For instance, the number of grand master blades 706 can be further increased and each grand master blade 706 can be connected to another master blade (referred to as a great grand master blade). Like the master blade 702, the grand master blades 706 may also be connected to a processor (e.g., processor 106) for programming the power controller FPGAs thereof and control the operation of the grand master blades 706. Referring to FIG. 7, in the cascaded configuration illustrated, the master blade 702 may be considered as a "slave" to the grand master blade 706. At the same time, the master blade 702 functions as the "master" to the slave blades 704. Thus, on one hand, the master blade 702 acts as a slave by operating based on the power management signals exchanged with the grand master blade 706, and on the other hand, acts as a master to the slave blades 704 based on the power management signals exchanged with the slave blades 704. The power controller FPGA 203 of the master blade 702 is configured with such a dual role of the master blade 702.

To generalize, N (where N>1) master blades 702 may be connected to a grand master blade 706, resulting in the scale of the number of programmable logic devices increased by N times. Further, M (where M>1) grand master blades 706 may be connected to a great grand master blade to increase the scale of the number of programmable logic devices by N×M times. As will be understood, there is no upper limit to the number of levels of master blade and slave blades, and such cascading can include multiple levels resulting in unlimited scaling of the number of programmable logic devices.

The above-mentioned power control processes according to embodiments disclosed in FIGS. 3-6 and 8-9 (below), and power control processes including desired order and delay, local override mode, individual mode, and group mode can be equally implemented in the system 700. The three power management signals power control signal PWR, power status signal STAT, and presence signal PRSN are exchanged (indicated by 'X3' in FIG. 7) between each master blade and the slave blades in each level.

Figure 8:
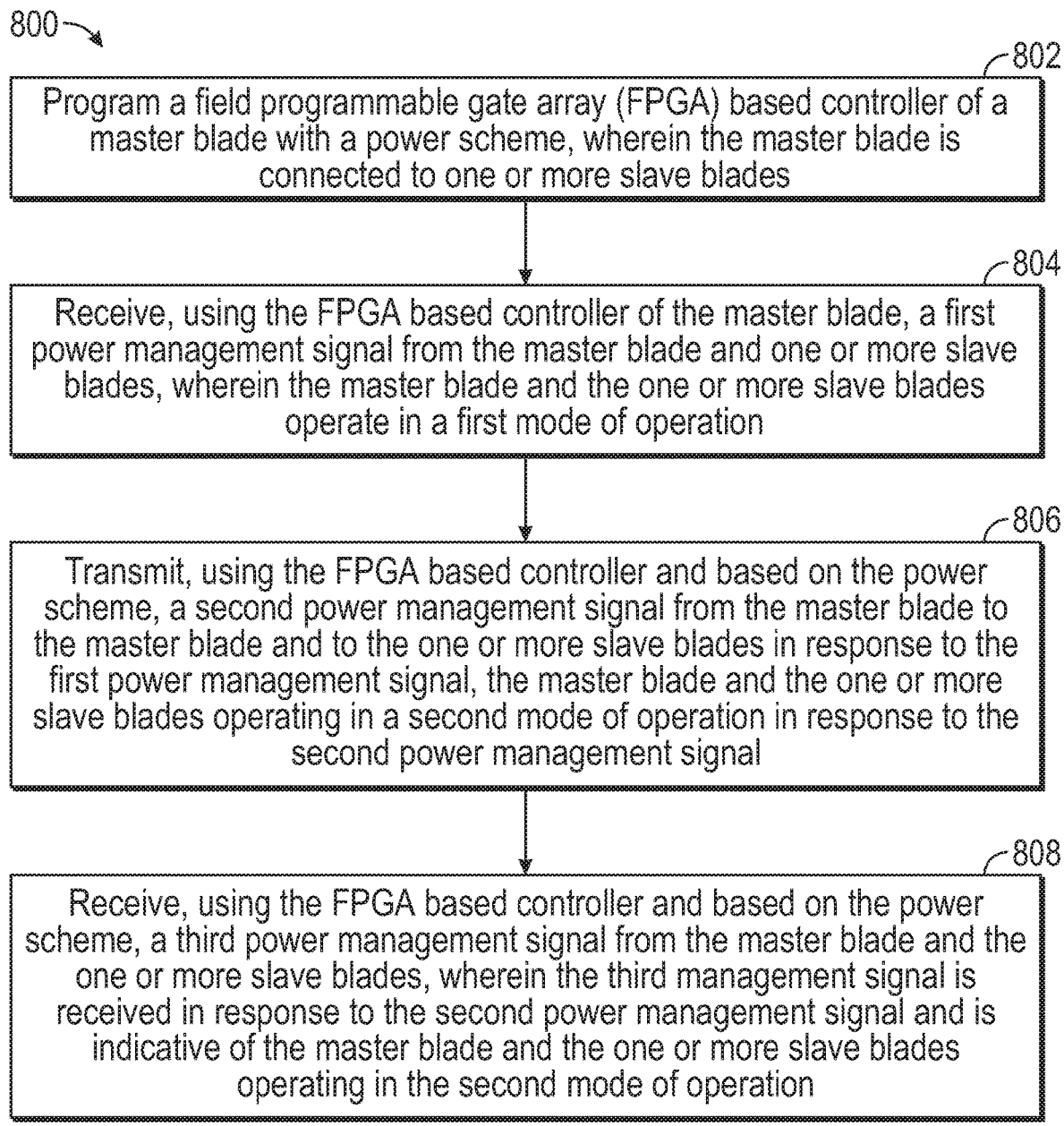
FIG. 8 is a flowchart including steps in a method for managing power provided to a master blade and to a plurality of slave blades connected to the master blade, according to some embodiments.

FIG. 8 is a flowchart including steps in a method 800 for managing power provided to a master blade and a plurality of slave blades connected to the master blade, according to some embodiments. Method 800 may be performed at least partially by the processor 106 (FIG. 1), the power controller FPGA 203, and/or a computer system 1000 (See below, FIG. 10). Methods consistent with the present disclosure may include at least some, but not all, of the steps illustrated in method 800, performed in a different sequence. Furthermore, methods consistent with the present disclosure may include at least two or more steps as in method 800 performed overlapping in time, or almost simultaneously.

Step 802 includes programming a Field Programmable Gate Array (FPGA) based controller of a master blade with a power scheme. The master blade is connected to one or more slave blades.

Step 804 includes receiving, using the FPGA based controller of the master blade, a first power management signal from the master blade and one or more slave blades. The master blade and the one or more slave blades operate in a first mode of operation.

Step 806 includes transmitting, using the FPGA based controller and based on the power scheme, a second power management signal from the master blade to the master blade and to the one or more slave blades in response to the first power management signal. The master blade and the one or more slave blades operate in a second mode of operation in response to the second power management signal.

Step 808 includes receiving, using the FPGA based controller and based on the power scheme, a third power management signal from the master blade and the one or more slave blades. The third power management signal is received in response to the second power management signal and is indicative of the master blade and the one or more slave blades operating in the second mode of operation.

Figure 9:
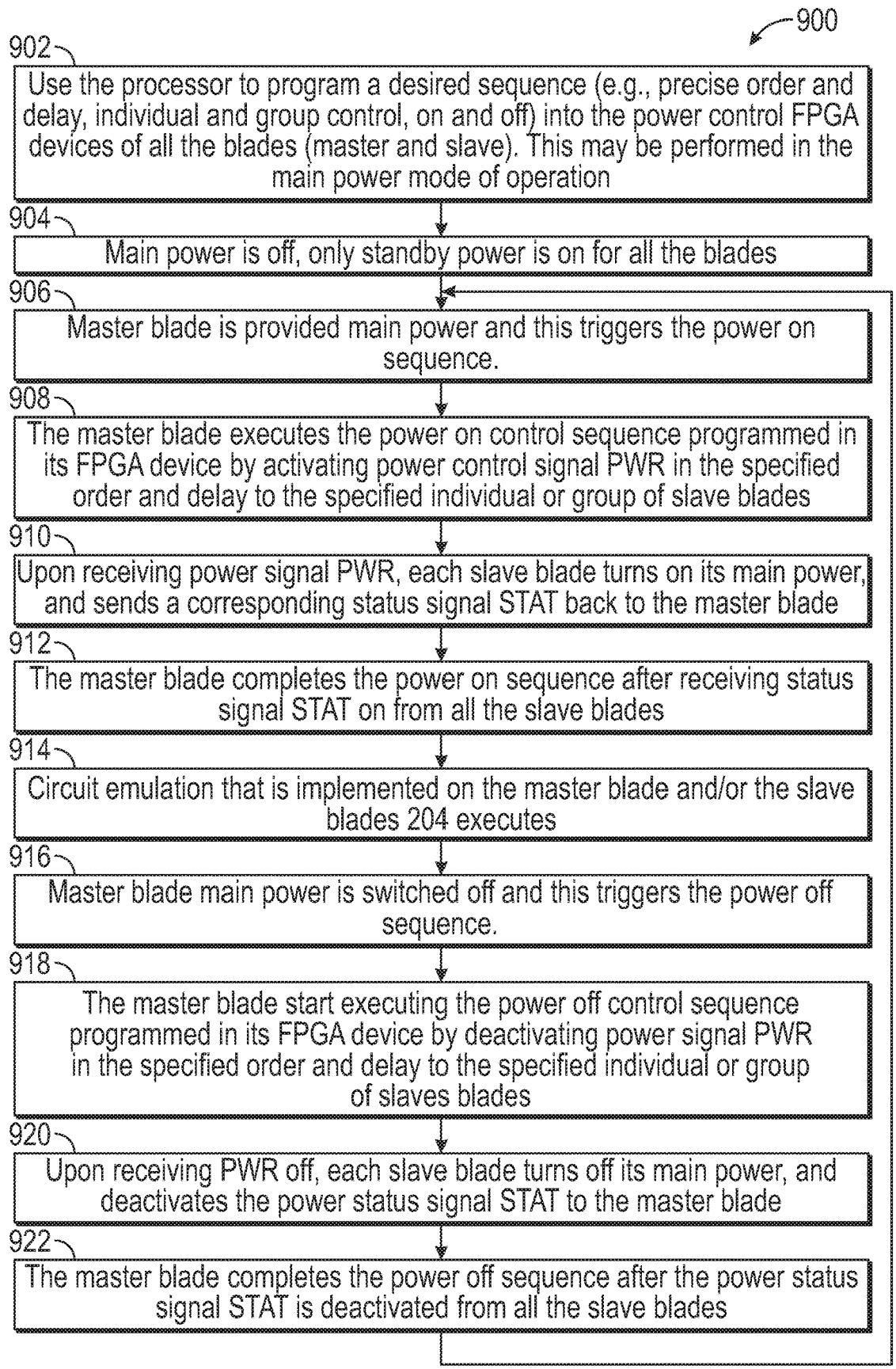
FIG. 9 is a flowchart including steps in another method for managing power provided to a master blade and to a plurality of slave blades connected to the master blade, according to some embodiments.

FIG. 9 illustrates a flowchart including steps in a method 900 for managing power provided to a master blade and a plurality of slave blades connected to the master blade, according to some embodiments. Method 900 may be performed at least partially by the processor 106 (FIG. 1), the power controller FPGA 203, and/or a computer system 1000 (See below, FIG. 10). Methods consistent with the present disclosure may include at least some, but not all, of the steps illustrated in method 800, performed in a different sequence. Furthermore, methods consistent with the present disclosure may include at least two or more steps as in method 800 performed overlapping in time, or almost simultaneously. Step 902 includes programming a desired power scheme (e.g., order and delay, individual and group control, on and off) into the power controller FPGAs 203 of the master blade 202 and the slave blades 204. In an embodiment, the programming may be performed using the processor 106. In another embodiment, this step may be performed in the main power mode of operation. The method 900 then proceeds to step 904 wherein the master blade 202 and the slave blades 204 are plugged in to power source (e.g., wall outlet) and only standby power is on for all the master blade 202 and the slave blades 204. In step 906, the master blade 202 is provided main power and this triggers the power on sequence that is programmed into the power controller FPGAs 203.

In step 908, the master blade 202 executes the power on sequence programmed in its power controller FPGA 203 by activating (or transmitting) power signal PWR in the specified order and delay to the specified individual or group of slave blades 204. In step 910, upon receiving the power signal PWR, each blade turns on its main power, and sends power status signal STAT back to the master blade 202. In step 912, the master blade 202 completes the power on sequence after receiving the power status signal STAT from all the blades connected thereto. In step 914, the circuit emulation that is implemented on the master blade 202 and/or the slave blades 204 executes. In step 916, the master blade 202 main power is switched off and this triggers the power off sequence. In step 918, the master blade 202 start executing the power off sequence programmed in its power controller FPGA 203 by deactivating the power signal PWR in the specified order and delay to the specified individual or group of slave blades 204. In step 920, when the power signal PWR is deactivated, each slave blade 204 turns off its main power, and sends power status signal STAT off back to the master blade 202. In step 922, the master blade 202 completes the power off sequence after the power status signal STAT is deactivated from all the slave blades 204. The method 900 then proceeds back to step 906.

Figure 10:
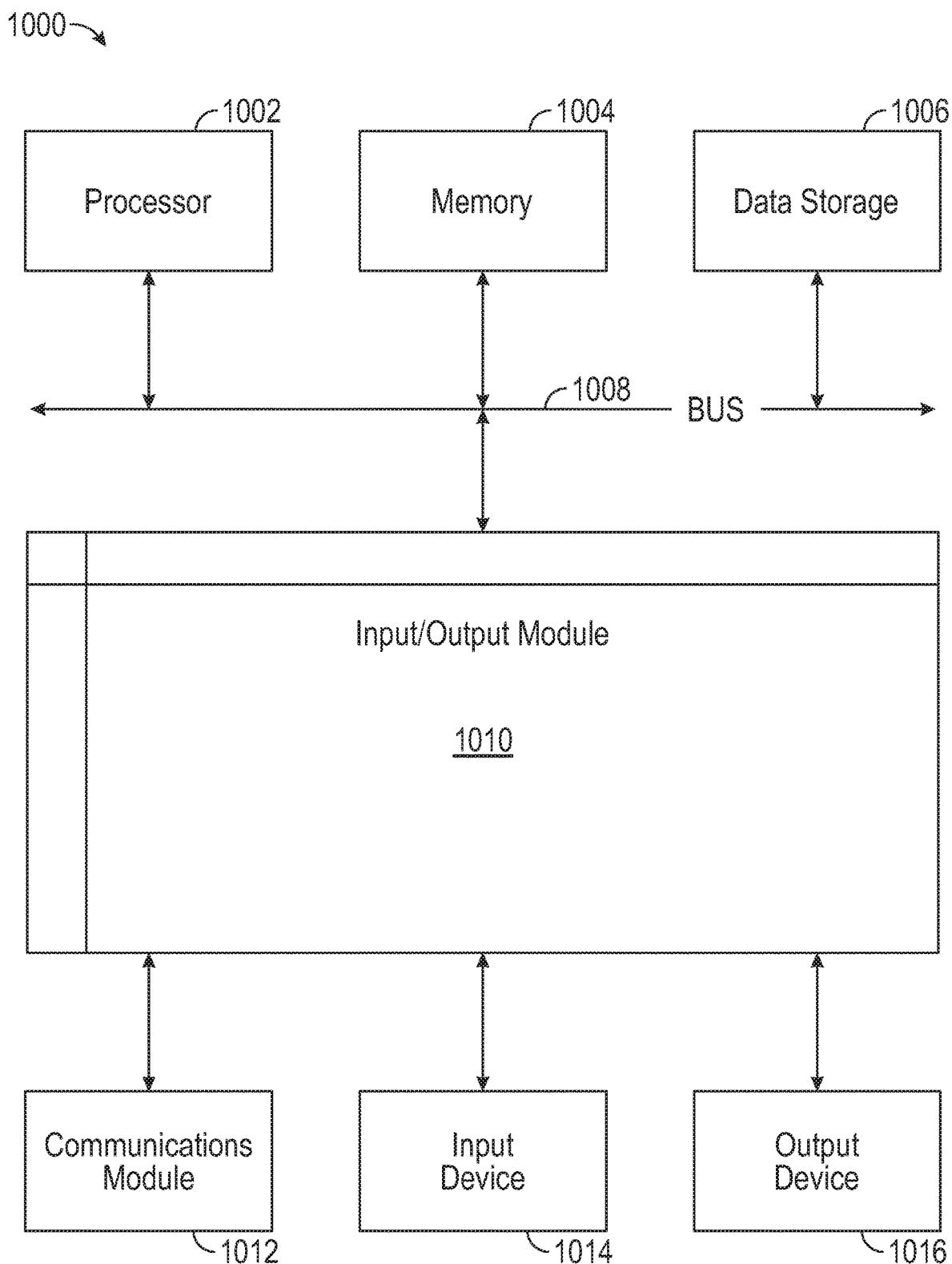
FIG. 10 is a block diagram illustrating an example computer system with which the system in FIG. 2 can be controlled to provide power to the master blades and slave blades in accordance with the method in FIGS. 8 and 9, according to some embodiments.

FIG. 10 is a block diagram illustrating an example computer system 1000 with which power provided to the master blade 202 and the slave blades 204 in FIG. 2 can be controlled in accordance with the methods illustrated in FIG. 8, according to some embodiments. In certain aspects, computer system 1000 can be implemented using hardware or a combination of software and hardware, either in a dedicated server, integrated into another entity, or distributed across multiple entities.

Computer system 1000 includes a bus 1008 or other communication mechanism for communicating information, and a processor 1002 coupled with bus 1008 for processing information. By way of example, computer system 1000 can be implemented with one or more processors 1002. Processor 1002 can be a general-purpose microprocessor, a microcontroller, a Digital Signal Processor (DSP), an Application Specific Integrated Circuit (ASIC), a Field-Programmable Gate Array (FPGA), a Programmable Logic Device (PLD), a controller, a state machine, gated logic, discrete hardware components, or any other suitable entity that can perform calculations or other manipulations of information. In some embodiments, processor 1002 may include modules and circuits configured as a 'placing' tool or engine, or a 'routing' tool or engine, to place devices and route channels in a circuit layout, respectively and as disclosed herein.

Computer system 1000 includes, in addition to hardware, code that creates an execution environment for the computer program in question, e.g., code that constitutes processor firmware, a protocol stack, a database management system, an operating system, or a combination of one or more of them stored in an included memory 1004, such as a Random Access Memory (RAM), a flash memory, a Read-Only Memory (ROM), a Programmable Read-Only Memory (PROM), an Erasable PROM (EPROM), registers, a hard disk, a removable disk, a CD-ROM, a DVD, or any other suitable storage device, coupled to bus 1008 for storing information and instructions to be executed by processor 1002. Processor 1002 and memory 1004 can be supplemented by, or incorporated in, special purpose logic circuitry.

The instructions may be stored in memory 1004 and implemented in one or more computer program products, e.g., one or more modules of computer program instructions encoded on a computer-readable medium for execution by, or to control the operation of, the computer system 1000, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NETLIST), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 1004 may also be used for storing temporary variable or other intermediate information during execution of instructions to be executed by processor 1002.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 1000 further includes a data storage device 1006 such as a magnetic disk or optical disk, coupled to bus 1008 for storing information and instructions.

Computer system 1000 is coupled via input/output module 1010 to various devices. The input/output module 1010 is any input/output module. Example input/output modules 1010 include data ports such as USB ports. The input/output module 1010 is configured to connect to a communications module 1012. Example communications modules 1012 include networking interface cards, such as Ethernet cards and modems. In certain aspects, the input/output module 1010 is configured to connect to a plurality of devices, such as an input device 1014 and/or an output device 1016. Example input devices 1014 include a keyboard and a pointing device, e.g., a mouse or a trackball, by which a user can provide input to the computer system 1000. Other kinds of input devices 1014 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 1016 include display devices, such as an LED (light emitting diode), CRT (cathode ray tube), or LCD (liquid crystal display) screen, for displaying information to the user.

Methods as disclosed herein may be performed by computer system 1000 in response to processor 1002 executing one or more sequences of one or more instructions contained in memory 1004. Such instructions may be read into memory 1004 from another machine-readable medium, such as data storage device 1006. Execution of the sequences of instructions contained in main memory 1004 directs processor 1002 to perform the process steps described herein (e.g., as in method 800). One or more processors in a multi-processing arrangement may also be employed to execute the sequences of instructions contained in memory 1004. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., Ethernet switch 250, and the like. For example, some aspects of the subject matter described in this specification may be performed on a cloud-computing environment. Accordingly, in certain aspects, a user of systems and methods as disclosed herein may perform at least some of the steps by accessing a cloud server through a network connection. Further, data files, circuit diagrams, performance specifications, and the like resulting from the disclosure may be stored in a database server in the cloud-computing environment, or may be downloaded to a private storage device from the cloud-computing environment.

Computing system 1000 includes servers and personal computer devices. A personal computing device and server are generally remote from each other and typically interact through a communication network. The relationship of client and server arises by virtue of computer programs running on the respective computers and having a client-server relationship to each other. Computer system 1000 can be, for example, and without limitation, a desktop computer, laptop computer, or tablet computer. Computer system 1000 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer-readable medium" as used herein refers to any medium or media that participates in providing instructions or data to processor 1002 for execution. Such a medium may take many forms, including, but not limited to, non-volatile media, volatile media, and transmission media. Non-volatile media include, for example, optical disks, magnetic disks, or flash memory, such as data storage device 1006. Volatile media include dynamic memory, such as memory 1004. Transmission media include coaxial cables, copper wire, and fiber optics, including the wires that comprise bus 1008. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method, comprising:
    programming a Field Programmable Gate Array (FPGA) based controller of a master blade with a power scheme, wherein the master blade is connected to one or more slave blades;
    receiving, using the FPGA based controller of the master blade, a first power management signal from the master blade and one or more slave blades, wherein the master blade and the one or more slave blades operate in a first mode of operation;
    transmitting, using the FPGA based controller and based on the power scheme, a second power management signal from the master blade to the master blade and to the one or more slave blades in response to the first power management signal, the master blade and the one or more slave blades operating in a second mode of operation in response to the second power management signal; and
    receiving, using the FPGA based controller and based on the power scheme, a third power management signal from the master blade and the one or more slave blades, wherein the third power management signal is received in response to the second power management signal and is indicative of the master blade and the one or more slave blades operating in the second mode of operation.

2. The computer-implemented method of claim 1, wherein a power consumption of the master blade and plurality of the slave blades is lower in the first mode of operation than in the second mode of operation.

3. The computer-implemented method of claim 1, wherein the power scheme indicates transmitting the second power management signal from the master blade to the master blade and the one or more slave blades simultaneously.

4. The computer-implemented method of claim 3, wherein the power scheme includes receiving the third power management signal from the master blade and the one or more slave blades simultaneously.

5. The computer-implemented method of claim 1, wherein the power scheme includes transmitting the second power management signal to the master blade and the one or more slave blades at different times.

6. The computer-implemented method of claim 5, wherein the power scheme includes receiving the third power management signal from the master blade and the one or more slave blades at different times.

7. The computer-implemented method of claim 1, further comprising:

executing circuit emulations stored on the master blade and the one or more slave blades;

after the circuit emulations have been executed, deactivating, using the FPGA based controller and based on the power scheme, the second power management signal to indicate to the master blade and the one or more slave blades to operate in the first mode of operation; and receiving, using the FPGA based controller and based on the power scheme, a deactivated third power management signal from the master blade and the one or more slave blades indicative of an operation in the first mode of operation.

8. The computer-implemented method of claim 7, wherein the power scheme includes deactivating the second power management signal simultaneously from the master blade and the one or more slave blades.

9. The computer-implemented method of claim 8, wherein the power scheme includes receiving the deactivated third power management signal from the master blade and the one or more slave blades simultaneously.

10. The computer-implemented method of claim 7, wherein the power scheme includes deactivating the second power management signal from the master blade and the one or more slave blades at different times, wherein the power scheme controls an order in which the second power management signal is transmitted to the master blade and the one or more slave blades and delays between transmitting the second power management signal to the master blade and the one or more slave blades.

11. The computer-implemented method of claim 10, wherein the power scheme includes receiving the deactivated third power management signal from the master blade and the one or more slave blades at different times, wherein the power scheme precisely controls an order in which the third power management signal is received from the master blade and the one or more slave blades and delays between receiving the third power management signal from the master blade and the one or more slave blades.

12. A system, comprising
a first master blade connected to one or more first slave blades, the first master blade and the one or more first slave blades each including a first Field Programmable Gate Array (FPGA) based controller programmed with a first power scheme;
a memory storing instructions; and
a processor communicably coupled to the first master blade and configured to execute the instructions to direct the first master blade to:
receive, using the first FPGA based controller of the first master blade and based on the first power scheme, a first power management signal from the first master blade and one or more first slave blades, wherein the first master blade and the one or more first slave blades operate in a first mode of operation;
transmit, using the first FPGA based controller of the first master blade and based on the first power scheme, a second power management signal from the first master blade to the first master blade and the one or more first slave blades in response to the first power management signal, the first master blade and the one or more first slave blades operating in a second mode of operation in response to the second power management signal; and
receive, using the first FPGA based controller of the first master blade and based on the first power scheme, a third power management signal from the first master blade and the one or more first slave blades, wherein the third power management signal is received in response to the second power management signal and is indicative of the first master blade and the one or more first slave blades operating in the second mode of operation.

13. The system of claim 12, wherein each of the first master blade and one or more first slave blades includes a plurality of first programmable logic devices, and the system further comprises:
a plurality of first master blades, each connected to one or more first slave blades; and
a second master blade including a plurality of second programmable logic devices and a second FPGA based controller programmed with a second power scheme, wherein the second master blade is connected to each first master blade of the plurality of first master blades, and wherein the processor is communicably coupled to the second master blade and configured to execute the instructions to direct the second master blade to:
receive, using the second FPGA based controller of the second master blade and based on the second power scheme, a fourth power management signal from the second master blade and one or more first master blades, wherein the second master blade and the one or more first master blades operate in a third mode of operation;
transmit, using the second FPGA based controller of the second master blade and based on the second power scheme, a fifth power management signal from the second master blade to the second master blade and the one or more first master blades in response to the first power management signal, the second master blade and the one or more first master blades operating in a fourth mode of operation in response to the fifth power management signal; and
receive, using the second FPGA based controller of the second master blade and based on the second power scheme, a sixth power management signal from the second master blade and the one or more first master blades, wherein the sixth power management signal is received in response to the fifth power management signal and is indicative of the second master blade and the one or more first master blades operating in the fourth mode of operation.

14. The system of claim 12, wherein each of the first master blade and the one or more first slave blades includes a plurality of first programmable logic devices, and the system further comprises:
N (N>1) first master blades, each connected to one or more first slave blades, and thereby increasing a number of first programmable logic devices by N times; and
M (M>1) second master blades, each including a plurality of second programmable logic devices, wherein the N second master blades are connected to one or more of the N first master blades, thereby increasing a number of programmable logic devices by N×M times.

15. The system of claim 12, wherein the first power scheme includes transmitting the second power management signal to the first master blade and the one or more first slave blades simultaneously.

16. The system of claim 15, wherein the first power scheme includes receiving the third power management signal from the first master blade and the one or more first slave blades simultaneously.

17. The system of claim 12, wherein the first power scheme includes transmitting the second power management signal to the first master blade and the one or more first slave blades at different times, wherein the first power scheme controls an order in which the second power management signal is transmitted to the first master blade and the one or more first slave blades and delays between transmitting the second power management signal to the first master blade and the one or more first slave blades.

18. The system of claim 17, wherein the first power scheme includes receiving the third power management signal from the first master blade and the one or more first slave blades at different times, wherein the first power scheme controls an order in which the third power management signal is received from the first master blade and the one or more first slave blades and delays between receiving the third power management signal from the first master blade and the one or more first slave blades.

19. A non-transitory, computer-readable medium storing instructions which, when executed by a processor, direct the processor communicably connected to a master blade perform a method, the master blade including a Field Programmable Gate Array (FPGA) based controller programmed with a power scheme and connected to one or more slave blades, the method comprising:

receiving, using the FPGA based controller of the master blade and based on the power scheme, a first power management signal from the master blade and one or more slave blades, wherein the master blade and the one or more slave blades operate in a first mode of operation;

transmitting, using the FPGA based controller of the master blade and based on the power scheme, a second power management signal from the master blade to the master blade and the one or more slave blades in response to the first power management signal, the master blade and the one or more slave blades operating in a second mode of operation in response to the second power management signal; and receiving, using the FPGA based controller of the master blade and based on the power scheme, a third power management signal from the master blade and the one or more slave blades, wherein the third management signal is received in response to the second power management signal and is indicative of the master blade and the one or more slave blades operating in the second mode of operation.

20. The non-transitory, computer-readable medium of claim 19, wherein the method further comprises:

executing circuit emulations stored on the master blade and the one or more slave blades;

after the circuit emulations have been executed, deactivating, using the FPGA based controller and based on the power scheme, the second power management signal by the master blade to indicate to the master blade and the one or more slave blades to operate in the first mode of operation, wherein the second power management signal is deactivated simultaneously from the master blade and the one or more slave blades; and receiving, using the FPGA based controller and based on the power scheme, a deactivated third power management signal from the master blade and the one or more slave blades indicative of an operation in the first mode of operation, wherein the deactivated third power management signal is received by the master blade from the master blade and the one or more slave blades simultaneously.

* * * * *